(12) United States Patent
Li et al.

(10) Patent No.: US 9,846,373 B2
(45) Date of Patent: Dec. 19, 2017

(54) HIGH ACCURACY MEASUREMENT SYSTEM FOR FOCUSING AND LEVELING

(71) Applicant: The Institute of Optics and Electronics, The Chinese Academy of Sciences, Chengdu, Sichuan (CN)

(72) Inventors: Yanli Li, Sichuan (CN); Wei Yan, Sichuan (CN); Song Hu, Sichuan (CN); Jian Wang, Sichuan (CN); Jinhua Feng, Sichuan (CN)

(73) Assignee: The Institute of Optics and Electronics, The Chinese Academy of Sciences, Chengdu, Sichuan (CN)

( * ) Notice: Subject to any disclaimer, the term of this patent is extended or adjusted under 35 U.S.C. 154(b) by 30 days.

(21) Appl. No.: 14/996,668

(22) Filed: Jan. 15, 2016

(65) Prior Publication Data

US 2017/0131641 A1 May 11, 2017

(30) Foreign Application Priority Data

Nov. 10, 2015 (CN) .......................... 2015 1 0762399

(51) Int. Cl.
*G01B 11/14* (2006.01)
*G03F 7/20* (2006.01)
(Continued)

(52) U.S. Cl.
CPC .......... *G03F 7/70641* (2013.01); *G01B 11/22* (2013.01); *G02B 5/3083* (2013.01);
(Continued)

(58) Field of Classification Search
CPC ... G03F 7/70641; G01B 11/12; G02B 5/3083; G02B 27/10; G02B 27/4255
(Continued)

(56) References Cited

U.S. PATENT DOCUMENTS 5,191,200 A  3/1993  van der Werf et al.
6,765,647 B1  7/2004  Nishi

FOREIGN PATENT DOCUMENTS

CN  101187783 A  5/2008

OTHER PUBLICATIONS

Watanabe, M. et al., "Focusing and leveling based on water surface profile detection with interferometry for optical lithography", SPIE, 2197: 980-989 (1994).

*Primary Examiner* — Tri T Ton
(74) *Attorney, Agent, or Firm* — Merchant & Gould P.C.

(57) ABSTRACT

The present disclosure provides a high accuracy measurement system for focusing and leveling. The system determines an off-focus distance in the perpendicular direction within the exposure field and an inclination in the horizontal direction by measuring heights of four detection points on a substrate by using a four-channel detection method, thereby achieving focusing and leveling of the substrate. The detection of the substrate heights is implemented by a focusing method based on dual-channel light intensity modulation. Two superposed grating fringes are formed with phase difference of $\pi/2$. The shift can be resolved by the phase variation of corresponding fringes. According to the method, the off-focus distance can be derived. The present disclosure effectively eliminates the error due to the intensity changes caused by the fluctuations of the source or the reflectance of the substrate surface. The apparatus for focusing and leveling is easy to be implemented and has an accuracy of nanoscale.

8 Claims, 2 Drawing Sheets

(51) Int. Cl.
*G01B 11/22* (2006.01)
*G02B 5/30* (2006.01)
*G02B 27/10* (2006.01)
*G02B 27/42* (2006.01)
*G03F 9/00* (2006.01)

(52) U.S. Cl.
CPC ......... *G02B 27/10* (2013.01); *G02B 27/4255* (2013.01); *G03F 9/7026* (2013.01)

(58) Field of Classification Search
USPC .................................. 356/614–624, 399–401
See application file for complete search history.

HIGH ACCURACY MEASUREMENT SYSTEM FOR FOCUSING AND LEVELING

The present application claims priority to Chinese Application No. 201510762399.1, filed Nov. 10, 2015 and entitled "HIGH ACCURACY MEASUREMENT SYSTEM FOR FOCUSING AND LEVELING" which is incorporated herein by reference in its entirety.

TECHNICAL FIELD

The present disclosure relates to the field of detecting and leveling a focal plane, particularly, to a measurement system for focusing and leveling of a substrate in a projection lithographic system.

BACKGROUND

The lithographic apparatus (lithography machine) is one of important devices for producing large scale integrated circuits. With decreased feature size of integrated circuits and increased resolution of the lithographic apparatus, an effective depth of focus (DoF) for the lithography becomes smaller continuously. The projection lithographic device is a widely used device in the field of lithography. Even if cooperating with a wave-front technology (such as off-axis illumination, and the like), the DoF of the projection lithographic device is maintained on the order of one hundred nanometers, which is far from the fluctuation of the substrate surface caused by vacuum absorption warping, substrate flatness, the thickness of the resist, and the like. In order to maintain the substrate surface within the DoF of the projection system and to ensure the quality of the exposure pattern, some severe requirements have been provided for the focus detection system.

The previous focus detection methods commonly use a slit photometry to detect the focus. However, such a method is limited by the slit image quality and has a severe dependence on the image processing algorithms, and its accuracy is only at a level of a hundred nanometer, which can be only applied to the early lithography with a lower accuracy, such as, a photoelectric measurement method based on a raster and a four-quadrant detector (U.S. Pat. No. 5,191,200), a photoelectric measurement method based on a slit and a four-quadrant detector (U.S. Pat. No. 6,765,647B1), and the like. Subsequently, a focus detection method with a high accuracy based on laser interference (Focusing and leveling based on wafer surface profile detection with interferometry for optical lithography [C] Proc of SPIE, 1994, 2197: 980-989) has been proposed. However, a multiple layer interference of the resist film and fragile environment limit its application for using as a lithographic tool. Recently, the technology of producing a Moire fringe by using a grating having close periods has been introduced to the focus detection. The nanoscale accuracy and good processing adaptability enable the process become a promising alternative solution for focus detection, such as the photoelectric measurement method based on Moire fringe of gratings (CN: 200710171968). However, the Talbot effect due to the self-imaging of grating will reduce the contrast of Moire fringes, and have a negative effect on the debugging. Thus, it is hard to apply the Moire fringe method to the practical focal detection. Currently, the photoelectric measurement method based on gratings is still the most popular method for focusing and leveling. Although the method is of high accuracy and easy to implement, it is susceptible to the changes in light intensity which may be caused by the fluctuations of the source or the reflectance of the substrate surface, thereby decreasing the detection accuracy.

SUMMARY

For the above problems, an object of the present invention is to provide a high accuracy measurement system for focusing and leveling, which can solve the issue of a conventional photoelectric measurement method based on gratings mentioned above, i.e. the decreasing of accuracy due to intensity changes caused by the fluctuations of the source or the reflectance of the substrate surface.

For such an object, the present disclosure provides a high accuracy measurement system for focusing and leveling, which comprises a four-channel focusing measurement system which includes a first focusing measurement system, a second focusing measurement system, a third focusing measurement system and a fourth focusing measurement system, respectively. The first focusing measurement system consists of an illuminating system, a label grating, a first front telecentric optical system, a polarizer, a Savart plate, a photoelastic modulation system, a phase adjustment plate, a detection grating, a first rear telecentric optical system, a second rear telecentric optical system, a first photoelectric detector and a second photoelectric detector. The label grating is imaged on a substrate through the first telecentric optical system with an incident angle of 86°. The image reflected by the substrate is divided into two beams by a beam splitter after passing through the Savart plate, in which the first beam and the second beam are respectively imaged on the detecting grating. Further, the phase adjustment plate is configured to ensure that the phase difference between the two beams is equal to $\pi/2$ when an image of the label grating reflected by the substrate is imaged onto the detection grating. The first photoelectric detector and the second photoelectric detector are configured to detect the first beam transmission energy and the second beam transmission energy after forming a superposed grating by the label grating and the detection grating. The position information of the first photoelectric detector and the second photoelectric detector are fixed. When the substrate moves upwards and downwards, the positions of the image of label grating and the detection grating will be shifted. At the same time, the light intensities detected by the first photoelectric detector and the second photoelectric detector will also be varied. The position of the focal plane of the substrate can be accurately measured by calculating a ratio of the signals detected by the first photoelectric detector and the second photoelectric detector after being processed. Further, the structures of the second, the third and the fourth focusing measurement systems are identical to that of the first focusing measurement system.

The detection points of the four channel focal plane measurement system are placed within an exposure field of the substrate, and are distributed on an X axis and Y axis coordinate system which are built based on the center of the exposure filed of the substrate. Particularly, two detection points are symmetrically placed on the X axis, and two detection points are symmetrically placed on the Y axis.

The parameters of the label grating and the detection grating are identical to each other. These two gratings are both placed at a certain angle, such that the image of the label grating can be parallel imaged onto the detection grating, wherein the length of the detection grating should be sufficient to ensure that the first beam and the second beam after being split are both perpendicularly incident onto the detection grating without intersection and interference.

The photoelastic modulation system may comprise a first quarter wave plate, a photoelastic modulator, a second quarter wave plate and a polarizer.

A group of the beam splitters can divide the beam after passing through the Savart plate into two beams having the same intensity and in the same propagation direction.

The phase adjustment plate is used to ensure that the phase difference between the first beam and the second beam is π/2 when the label grating is imaged onto the detection grating.

The first image-side telecentric optical system may include an imaging module, which may be an image-side telecentric imaging module or a double telecentric imaging module. Each of the first object-side telecentric optical system and the second object-side telecentric optical system may include an imaging module, which may be an object-side telecentric imaging module or a double telecentric imaging module. The first image-side telecentric optical system is placed at a certain angle with respect to the first object-side telecentric optical system and the second object-side telecentric optical system, to ensure that the grating image which is imaged onto the substrate by the first image-side telecentric optical system can be reflected by the substrate, and then is imaged again on the detection grating to form a Moire fringe, and finally is received by the first photoelectric detector and the second photoelectric detector after passing through the first object-side telecentric optical system and the second object-side telecentric optical system, respectively.

The first photoelectric detector and the second photoelectric detector are required to detect the intensities of the first beam and the second beam simultaneously.

The advantages of the present disclosure are as follows:
1) the present disclosure can effectively eliminate the influence of the changes in intensity caused by the fluctuations of the source or the reflectance on the measure accuracy in photoelectric detection methods based on gratings, thereby improving the stability of the system.
2) the measurement system for focusing and leveling according to the present disclosure can not only have a simple structure which is easy to be implemented at a low cost and a strong anti-interference ability, but also a high accuracy and a high sensitivity.

DETAILED DESCRIPTION

The present disclosure will now be described with reference to the drawings.

Figure 1:
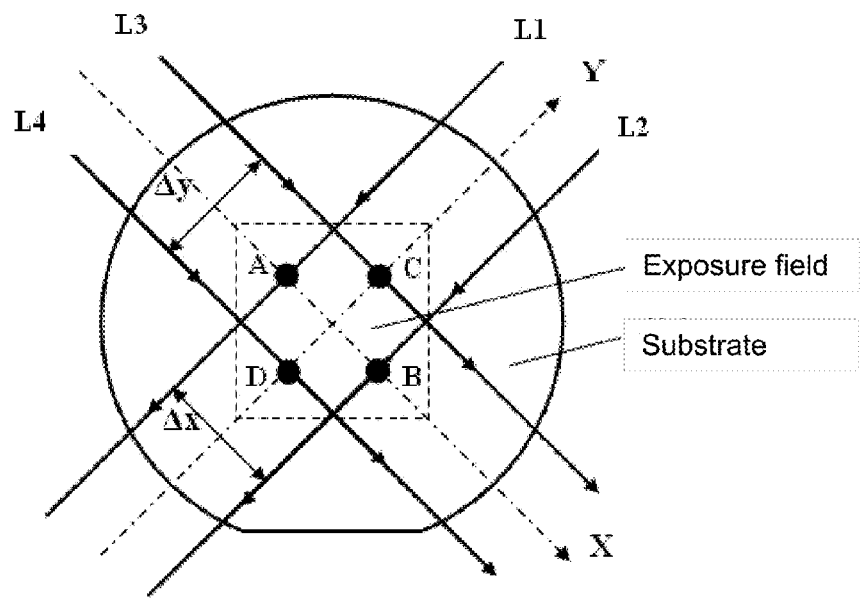
FIG. 1 is a block diagram of the focusing measurement system according to the present invention.

The present disclosure provides a high accuracy measurement system for focusing and leveling comprising a four-channel focusing measurement system. As shown in FIG. 1, there are a first focusing measurement system L1, a second focusing measurement system L2, a third focusing measurement system L3, and a fourth focusing measurement system L4. The detection points of the four-channel focusing measurement system are in an exposure filed of the substrate, and are distributed on an X axis and Y axis coordinate system which are built based on the center of the exposure filed of the substrate. Particularly, the detection point A and B are symmetrically placed on the X axis, and the detection points C and D are symmetrically placed on the Y axis. The focusing and leveling process is performed based on the data detected at the four detection points. Thus, the focusing measurement system is the key of the whole system, the accuracy of which directly determines accuracy and stability of the measurement system for focusing and leveling.

Figure 2:
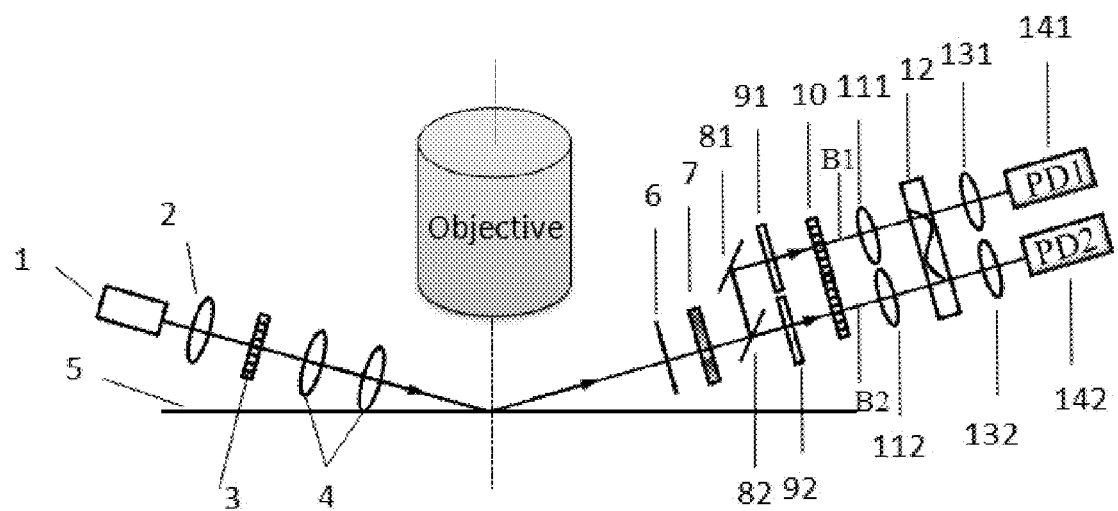
FIG. 2 is a layout of the focusing measurement system according to the present invention.
Figure 3:
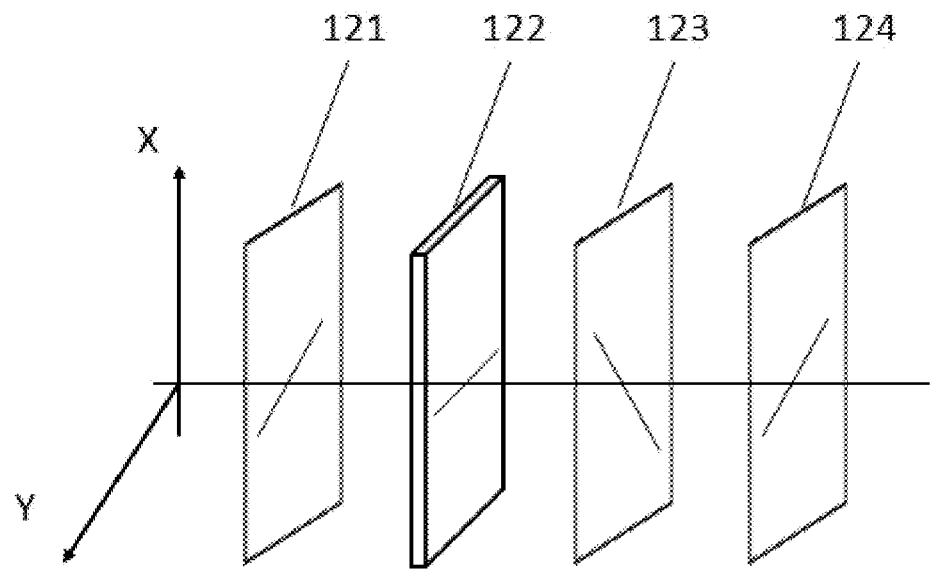
FIG. 3 is a block diagram of the photoelastic modulation system according to the present invention.

The first focusing measurement system is taken for an example. As shown in FIG. 2, the illuminating system of the first focusing measurement system consists of an illumination source 1 and a lens 2. Any kind of illumination source would be possible, as long as it has no or little influence on the lithographic process. The illuminating system is configured to ensure that the light emitted from thereon can be parallel incident onto the label grating 3. The incident angle is about 86 degree. The first telecentric optical system 4 images the label grating 3 onto the substrate 5, the image reflected by the substrate 5 passes through a polarizer 6 and a Savart plate 7, and then is imaged again onto the detection grating 10 by the beam splitters 81 and 82 and a phase adjustment plate. A group of the beam splitters divides the beam reflected by the substrate into two beams having the same intensity and in the same propagation direction, i.e., a first beam B1 and a second beam B2. The phases of these two beams are adjusted by a first phase adjustment plate 91 and a second phase adjustment plate 92 respectively, such that the phase difference of the first beam B1 and the second beam B2 is equal to π/2, when they are imaged on the detection grating. After passing through the photoelastic modulation system 12, the first telecentric optical system 131 and a second telecentric optical system 132, the first beam B1 and the second beam B2 are simultaneously received by the first photoelectric detector 141 and the second photoelectric detector 142, respectively. As shown in FIG. 3, the photoelastic modulation system may include a first quarter wave plate 121, a photoelastic modulator 122, a second quarter wave plate 123 and a polarizer 124, the main function of which is to add a high-frequency carrier, which can improve the capability of resisting noise and interference. When the substrate moves upwards and downwards, the positions of the image of label grating 3 and the detection grating 10 will be shifted. At the same time, the light intensities detected by the first photoelectric detector 141 and the second photoelectric detector 142 will also be varied. After being demodulated by the processing circuit, the position of the focal plane can be accurately measured by calculating a ratio.

It is assumed that the incident intensity of the source is I(x), and the intensity of the first beam divided by the beam splitter is I(x)/2 without considering the loss, the intensity $I_{PD1}(x)$ received by the first photoelectric detector 141 is defined as:

$$I_{PD1}(x) = \frac{I(x)}{4}\left|2 + \frac{4}{\pi}\cos\varphi(x)\cos\frac{2\pi s}{p}\right| + \frac{I(x)}{4}\left|-\frac{4}{\pi}\sin\varphi(x)\sin\frac{2\pi s}{p}\right| \times \sin\delta(t) \quad (1)$$

wherein $\phi(x)=2\pi x/p$, $\phi(x)$ represents to a modulated phase including an information on the position deviation of the grating; p represents to a grating period of the label grating and the detection grating; $\delta(t)=\pi \sin(2\pi ft)/2$; $\delta(t)$ refers to the phase difference between the photoelastic modulator and the incident beam; and s refers to the shearing amount of the Savart plate.

It is noted that the photoelastic modulator may only influence the second item in equation (1), and both items in equation (1) are affected by the shearing amount of the Savart plate. When the first item becomes a constant, and the second item achieves sin (2πs/p)=1, the signal noise ratio (SNR) is optimized. If the shearing amount of the Savart plate is s=p/4, the equation (1) can be expressed as:

$$I_{PD1}(x) = \frac{I(x)}{2} + \frac{I(x)}{\pi}\sin\varphi(x)\cdot\sin\delta(t) \qquad (2)$$

Omitting the DC component, the above equation is changed into:

$$I_{PD1}(x) = AI(x)\sin\varphi(x)\cdot\sin\delta(t) \qquad (3)$$

Wherein A is a constant. Since the phase difference between the first beam B1 and the second beam B2 is equal to π/2, the intensity $I_{PD2}(x)$ received by the second photoelectric detector 142 can be expressed as:

$$I_{PD2}(x) = (1-A)I(x)\sin(\varphi(x)+\pi/2)\cdot\sin\delta(t) \qquad (4)$$

Due to φ(x)=2πx/p, when the beam is split by the beam splitter equally, i.e. A=0.5, the deviation of the grating can be obtained according to equation (3) and (4), which means:

$$\Delta x = \frac{p}{2\pi}\arctan(I_{PD1}(x)/I_{PD2}(x)) \qquad (5)$$

Figure 4:
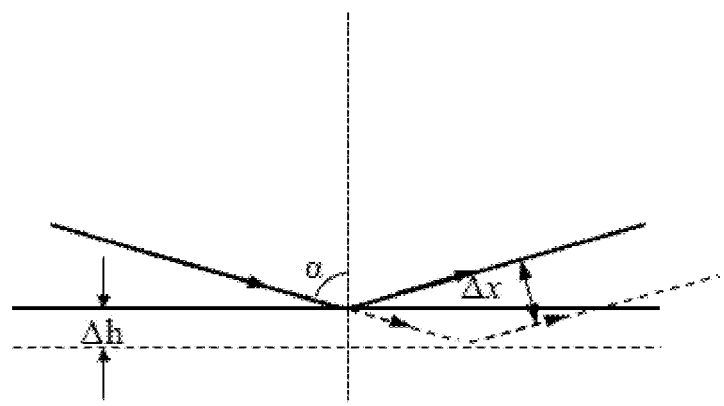
FIG. 4 is a model diagram for the focusing measurement according to the present invention.

If the upwards and downwards shift amount of the substrate and the deviation of the grating are shown in FIG. 4, the following equation can be derived:

$$\Delta h = \frac{1}{2\sin\alpha}\frac{p}{2\pi}\arctan(I_{PD1}(x)/I_{PD2}(x)) \qquad (6)$$

Since α is equal to 86°, sin α≈1. The equation (6) can be simplified as:

$$\Delta h = \frac{p}{4\pi}\arctan(I_{PD1}(x)/I_{PD2}(x)) \qquad (7)$$

From which, the deviation of the substrate can be determined by the ratio between the signals received at the first photoelectric detector 141 and the second photoelectric detector 142. The method according to the present disclosure can eliminate the influence by the light intensity changes caused by the source or the reflectance on the measure accuracy in photoelectric detection methods based on gratings, thereby improving the stability of the system.

Thus, the off-focus information at the four detection points as shown in FIG. 1 can be obtained, and the off-focus distance can be derived based on the following equation.

$$h_0 = \frac{h_a + h_b + h_c + h_d}{4} \qquad (8)$$

wherein $h_a$, $h_b$, $h_c$ and $h_d$ are the off-focus distances at the detection points A, B, C and D, respectively.

$\phi_x$ and $\phi_y$ are the rotation angles (转角) of the substrate with respect to the X axis and Y axis, which can be obtained from the following equation:

$$\varphi_x = \frac{h_d - h_c}{\Delta y} \qquad (9)$$

$$\varphi_y = \frac{h_b - h_a}{\Delta x} \qquad (10)$$

Wherein Δx and Δy are the distances from the detection point A to the detection point B and from the detection point C to the detection point D.

With cooperating with a decoupling algorithm at a workstation, a adjusting and leaving of the focal plane can be implemented by a 3-point actuator in real time, which means that the exposure field of the substrate can be adjusted to the optimized position of the focal plane for the objective.

We claim:

1. A high accuracy measurement apparatus for adjusting and leveling a focal plane, wherein the measurement apparatus for focusing and leveling comprises a four-channel focusing measurement device including a first focusing measurement device (L1), a second focusing measurement device (L2), a third focusing measurement device (L3) and a fourth focusing measurement device (L4), respectively;

the first focusing measurement device consists of an illuminating unit formed of a light source (1) and a lens (2), a label grating (3), a first image-side telecentric optical device (4), formed of two lens at the entrance side before a substrate (5), and a polarizer (6), an Savart plate (7), a photoelastic modulation device formed of beam splitters (81, 82), a phase adjustment plate (91, 92), a detection grating (10), a first object-side telecentric optical device, a second object-side telecentric optical device, a first photoelectric detector and a second photoelectric detector at a reflecting side after the substrate (5), in turn along a measuring light path;

the label grating (3) is imaged on a substrate (5) through the first telecentric optical device (4) with an incident angle of 86°;

the image reflected by the substrate (5) is divided into two beams by the beam splitter (81,82) after passing through the Savart plate, in which a first beam and a second beam are respectively imaged on the detecting grating (10);

the phase adjustment plate (91,92) is configured to ensure that the phase difference between the two beams is equal to π/2 when the image of the label grating (3) reflected by the substrate (5) is imaged onto the detection grating (10);

the first photoelectric detector (141) and the second photoelectric detector (142) are configured to detect the first beam transmission energy and the second beam transmission energy after forming a superposed grating by the label grating (3) and the detection grating (10);

the position information of the first photoelectric detector (141) and the second photoelectric detector (142) are fixed, and when the substrate (5) moves upwards and downwards, the positions of the image of label grating (3) and the detection grating (10) are also shifted; at the same time, the intensities detected by the first photoelectric detector (141) and the second photoelectric detector (142) are also varied;

the position of the focal plane of the substrate (5) is accurately measured by calculating a ratio of the signals detected by the first photoelectric detector (141) and the second photoelectric detector (142) after being processed; and the structures of the second, the third and the fourth focusing measurement devices are identical to that of the first focusing measurement device.

2. The high accuracy measurement apparatus for focusing and leveling according to claim 1, wherein each of the four-channel focusing measurement device has the same structure and principle, and the detection points of the four-channel focusing measurement device are placed within an exposure field of the substrate, and are distributed on an X axis and Y axis coordinate system which are built based on the center of the exposure filed of the substrate, wherein two detection points are symmetrically placed on the X axis, and two detection points are symmetrically placed on the Y axis.

3. The high accuracy measurement device for focusing and leveling according to claim 1, wherein the parameters of the label grating and the detection grating are identical to each other, and these two gratings are both placed at a certain angle, such that the image of the label grating is parallel imaged onto the detection grating, wherein the length of the detection grating is sufficient to ensure that the first beam and the second beam after being split are both perpendicularly incident onto the detection grating without intersection and interference.

4. The high accuracy measurement device for focusing and leveling according to claim 1, wherein the photoelastic modulation device comprises a first quarter wave plate, a photoelastic modulator, a second quarter wave plate and a polarizer.

5. The high accuracy measurement apparatus for focusing and leveling according to claim 1, wherein a group of the beam splitters divides the beam after passing through the Savart plate into two beams having the same intensity and in the same propagation direction.

6. The high accuracy measurement apparatus for focusing and leveling according to claim 1, wherein the phase adjustment plate is configured to ensure that the phase difference between the first beam and the second beam is $\pi/2$ when the label grating is imaged onto the detection grating.

7. The high accuracy measurement apparatus for focusing and leveling according to claim 1, wherein the first image-side telecentric optical device includes an imaging module, which is an image-side telecentric imaging module or a double telecentric imaging module;

each of the first object-side telecentric optical device and the second object-side telecentric optical device include an imaging module, which is an object-side telecentric imaging module or a double telecentric imaging module;

the first image-side telecentric optical device is placed at a certain angle with respect to the first object-side telecentric optical device and the second object-side telecentric optical device, to ensure that the grating image which is imaged onto the substrate by the first image-side telecentric optical device is reflected by the substrate, and then is imaged again on the detection grating to form a Moire fringe, and finally is received by the first photoelectric detector and the second photoelectric detector after passing through the first object-side telecentric optical device and the second object-side telecentric optical device, respectively.

8. The high accuracy measurement apparatus for focusing and leveling according to claim 1, wherein the first photoelectric detector and the second photoelectric detector are required to detect the intensities of the first beam and the second beam simultaneously.

* * * * *